United States Patent
Agresti et al.

(10) Patent No.: US 7,498,613 B2
(45) Date of Patent: Mar. 3, 2009

(54) METHOD OF PROVIDING ELECTRICAL SEPARATION IN INTEGRATED DEVICES AND RELATED DEVICE

(75) Inventors: Michele Agresti, Turin (IT); Cesare Rigo, Turin (IT); Marco Vallone, Turin (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 150 days.

(21) Appl. No.: 11/496,136

(22) Filed: Jul. 31, 2006

(65) Prior Publication Data
US 2007/0052018 A1  Mar. 8, 2007

(51) Int. Cl.
| | |
|---|---|
| H01L 29/22 | (2006.01) |
| H01L 31/0256 | (2006.01) |
| H01L 31/0296 | (2006.01) |
| H01L 33/00 | (2006.01) |

(52) U.S. Cl. .......................... 257/103; 257/78
(58) Field of Classification Search ............ 257/88–103
See application file for complete search history.

(56) References Cited

U.S. PATENT DOCUMENTS

| | | | |
|---|---|---|---|
| 5,783,844 A * | 7/1998 | Kobayashi et al. .......... 257/103 |
| 6,692,837 B2 * | 2/2004 | Iga et al. ...................... 428/469 |
| 2002/0105992 A1 | 8/2002 | Arakawa et al. .............. 372/50 |
| 2004/0048406 A1 | 3/2004 | Ikeda et al. .................... 438/29 |
| 2005/0036729 A1 | 2/2005 | Kim et al. ...................... 385/14 |

FOREIGN PATENT DOCUMENTS

| | | |
|---|---|---|
| JP | 61-290790 | 12/1986 |
| JP | 62-213131 | 9/1987 |

OTHER PUBLICATIONS

Aoki et al. "High performance modulator/integrated light sources grown by an in-plane band-gap energy-control technique". OFC '95 Optical Fiber Communication, Summaries of Papers, vol. 8, pp. 25-26, Optical Society of America 1995.

* cited by examiner

Primary Examiner—Cuong Q Nguyen

(57) ABSTRACT

An integrated device includes two sections, such as a DFB laser and an EAM modulator, having a semi-insulating separation region therebetween. The separation region is of a material acting as a trap on electrons and configured to impede current flow between the two sections due to holes. The separation region may be of a material acting as a trap both on electrons and holes. Alternatively, the separation region is of a material that acts as a trap on electrons and is provided over a p-type substrate common to the two sections.

15 Claims, 1 Drawing Sheet

US 7,498,613 B2

METHOD OF PROVIDING ELECTRICAL SEPARATION IN INTEGRATED DEVICES AND RELATED DEVICE

FIELD OF THE INVENTION

The present disclosure relates to techniques for providing electrical separation in integrated devices. The invention was devised with specific attention paid to its possible application in increasing electrical separation in integrated opto-electronic devices with semi-insulating (SI) separation.

DISCUSSION OF THE BACKGROUND ART

The realisation of complex integrated devices requires efficient electrical separation between various sections of the device.

Current solutions to provide separation regions rely on proton implantation or introduction of defects (such as hydrogen complexes) by dry etching techniques, thus converting the original p- or n-type conduction material to semi-insulating. A further alternative solution lies in the partial removal of the upper cladding layer such as to obtain a restricted channel for carrier conduction.

Defect creation by proton implantation is a technique not easily accessible for production, while defects originated by dry-etching techniques tend to be partially eliminated by heat treatments. This also gives rise to concerns in terms of degradation of performance over time especially in the case of devices having high operating temperatures.

Patent documents generally exemplary of some of the techniques considered in the foregoing are US-B-6 597 718, EP-B-0 672 932 and US-A-2004/0084683.

Specifically, US-B-6 597 718 is exemplary of insulation obtained by the conventional method of reducing the upper cladding thickness to increase electrical separation. This document specifically refers to the integration of a Fabry-Perot laser with an EAM modulator.

EP-A-0 672 932 is exemplary of butt-joint passive region in which electrical insulation is obtained by proton implantation or iron doping.

US-A-2004/0084683 is exemplary of a technique based on the partial removal of the upper cladding layer, wherein electrical separation is achieved again via proton implantation or iron doping.

FIG. 1 of the annexed drawing is exemplary of a conventional prior art arrangement including a semi-insulating (SI) region between the sections to be separated. This arrangement includes two device sections A and B. While these sections may be of any known type, in the specific arrangement illustrated in FIG. 1, the section A has grown thereon a distributed feedback (DFB) grating. Both sections A and B have associated an upper cladding and contact layer 14 (typically of the p-type).

Reference numeral 16 designates a semi-insulating (SI) material provided as a separation between the sections A and B. Typical examples for semi-insulating materials for the region 16 are InP:Fe or InGaAsP.

Essentially, the principle of operation of semi-insulating region 16 as shown in FIG. 1 (which is typically grown after removal of the upper doped cladding) is related to that region being doped with elements providing deep acceptor traps, as for example InP:Fe. A disadvantage of this solution lies in that iron doped materials are effective in blocking electrons but have limited effects on holes.

The foregoing description of prior art arrangements clearly indicates that the need exists for techniques that may provide an improved electrical separation in integrated devices, especially as regards integrated optoelectronic devices.

The purpose the present disclosure is thus to provide such an improved solution.

SUMMARY OF THE INVENTION

According to the present disclosure, that object is achieved by means of the method having the features set forth in the claims that follow. The invention also relates to corresponding device. In brief, the arrangement described herein is based on the concept of producing a semi-insulating (SI) separation region between two sections of an integrated device wherein the separation region is of a material acting as a trap on electrons and is configured to impede current flow between said sections due to holes.

Such an arrangement can be produced e.g. by:
i) making the separation region of a material that acts as a trap both on electrons and holes, or
ii) making the separation region of a material that acts as a trap on electrons and providing said separation region over a p-type substrate common to said two sections.

In this latter case, the separation region may advantageously have a reversed structure starting from the p-type substrate such as to have an upper n-type cladding in which the sections to be isolated are defined; in that way, the residual current between these sections is due to electrons that are effectively blocked by the semi-insulating region.

Materials suitable for use within the framework of the invention include e.g. AlGaInAs, preferably grown at low temperatures. This material presents deep level traps acting on both electrons and holes. It can be grown at relatively low temperatures, which, in any case, are well above 450° C., for the commonly used MOVPE epitaxial technique, much higher that any subsequent current technological steps thus providing inherent stability in the arrangement produced.

Alternatively, the separation region may include a material such as InGaAsP that presents deep acceptor levels acting as electron traps. The material is caused to have an increased electrical resistivity e.g. by doping with a metal such as e.g. Fe. By using the conventional approach that consists in growing the active regions on an n-type InP substrate, electrons are efficiently blocked. However, in the separation region between two p-type layers, the current flowing between the sections is due to holes. An arrangement described herein uses a reversed structure starting from p-type InP substrate such as to have an upper n-type cladding in which the sections to be isolated are defined. In that way, the residual current between sections is due to electrons that are effectively blocked by the semi-insulating InGaAsP:Fe region.

Efficient electrical separation can thus be achieved without expensive insulation methods, with the additional technological step of a butt-joint regrowth. Additionally, the use of a quaternary InGaAsP layer gives the possibility of optically matching the two sections separated/insulated as may be the case of a device including a modulator such as an EAM modulator coupled with the laser source such as a DFB laser source. This arrangement minimises optical reflections likely to be detrimental to high frequency characteristics of these devices.

BRIEF DESCRIPTION OF THE DRAWINGS

The invention will now be described, by way of example only, by making reference to the enclosed figures of drawing, wherein.

DETAILED DESCRIPTION OF THE PREFERRED EMBODIMENT

Figure 1:
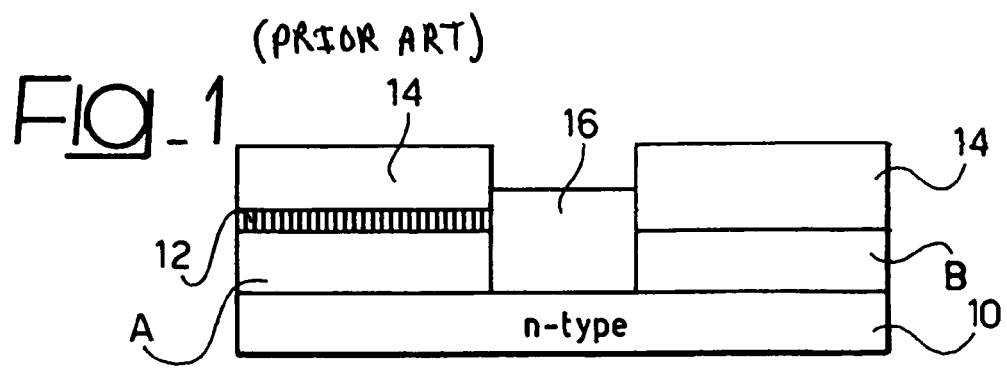
FIG. 1 is a schematic representation of a conventional integrated device according to the prior art.

The embodiment of the invention now described leads to an integrated device structure which is notionally identical to the prior art arrangement shown in FIG. 1: this facilitates direct comparison of the inventions to the prior art.

Specifically, the arrangement of FIGS. 2 to 4 again includes two integrated device sections A and B to be separated/insulated from each other. Again, while the sections A and B may be of any known type, in the exemplary arrangement described herein the two sections A and B may include, for instance, a laser source such as a distributed feedback (DFB) laser (section A) and a modulator such as an EAM modulator (section B) associated with the laser source of the section A.

Figure 2:
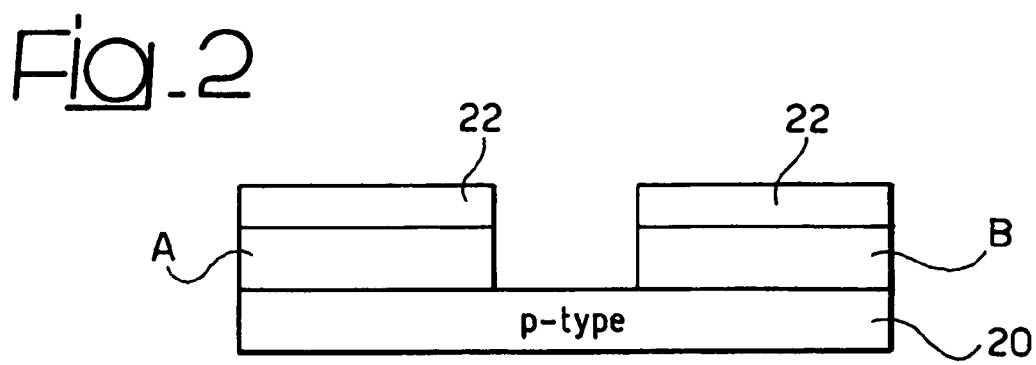
FIGS. 2 to 4 are schematic representation of the techniques for providing electrical separation in an integrated device according to the method of the present disclosure.
Figure 3:
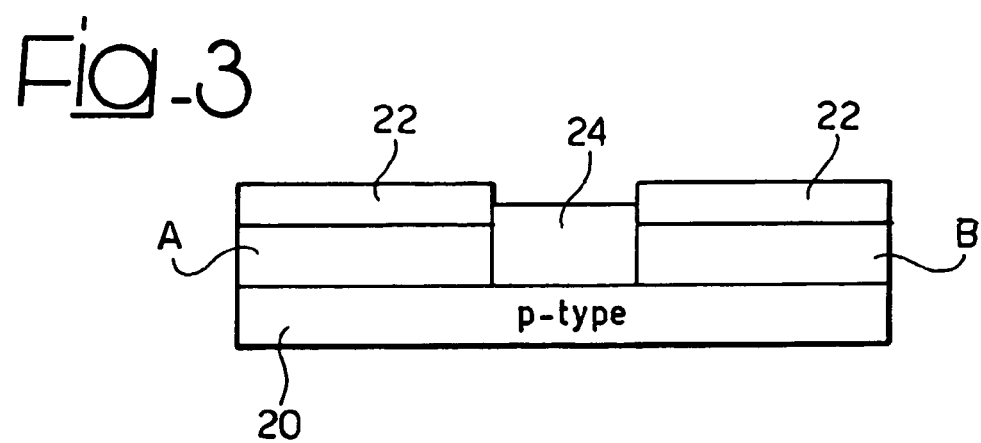
Figure 4:
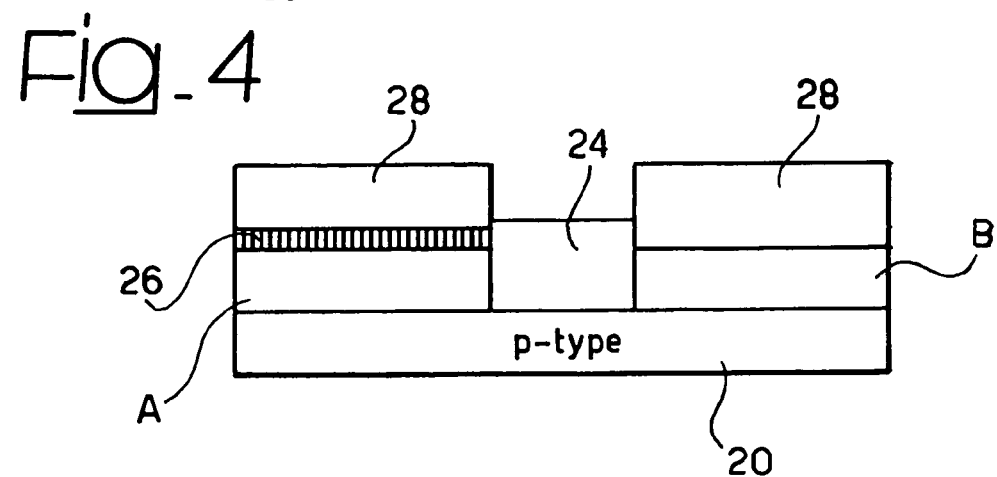

In the arrangement of FIGS. 2 to 4, the sections A and B again share a common substrate and buffer layer 20.

In contrast with the arrangement illustrated in FIG. 1 (where the substrate and buffer layer 10 is of an n-type) in the case of the arrangement of FIGS. 2 to 4, the layer 20 is comprised of a p-type semi-conductor layer. The sections A and B can be realised on such a common substrate e.g. by means of a double epitaxial step or selective area growth (SAG). The transition region between the two sections A and B is removed by conventional patterning and etching via e.g. dry-etching or wet-etching. In the case of wet-etching, the use of a stop etch layer (according to the prior art) is recommended.

In the sectional view of FIG. 2, the sections A and B are illustrated having superposed respective mask regions 22 as used to remove the transition region between the two sections.

The same masks 22 can be used (after the removal of the transition region) to perform to butt-coupling step with the deposition of semi-insulating (SI) of a material such as InGaAsP:Fe. This may occur by resorting to techniques that are known in the art, thus making it unnecessary to provide a more detailed description herein.

As indicated, InGaAsP:Fe is exemplary of a choice of a semi-conductor material iron (i.e. metal) doped to increase its electrical resistivity by providing deep acceptor levels acting as electron traps.

After forming the semi-insulating (SI) separation region 24, the masks 22 are removed (by known techniques) and the structure is terminated by providing e.g. a DFB grating 26 over the section A comprising the DFB laser source. Layers 28 of n-type material are then grown over the two sections A (with the interposition of the DFB grating 26) and B.

Typically, the n-type layer 28 intended to act as an upper cladding and contact layer is removed at the transition region where the separation region 24 is formed via wet selective chemical etching using the stop-etching properties of the InGaAsP layer or by conventional dry-etching.

In an alternative embodiment of the invention, essentially the same structure of FIG. 1 can be replicated, including an n-type substrate 10. In this case however, the material of the separation region 24 is selected to be a material such as AlGaInAs, presenting deep level traps acting on both electrons and holes.

Of course, without prejudice to the underlying principles of the invention, the details and the embodiments may vary, even significantly, with respect to what has been described by way of example only, without departing from the scope of the invention as defined in the annexed claims.

What is claimed is:

1. An integrated device comprising two sections A and B having a semi-insulating separation region disposed therebetween, wherein the separation region comprises a material configured to act as a trap for electrons and to impede current flow between sections A and B due to holes, the material of the separation region comprising AlGaInAs.

2. The device of claim 1, wherein the material of the separation region is further configured to act as a trap for electrons and holes.

3. The device of claim 1, wherein
the material of the separation region is further configured to act as a trap for electrons,
the device comprises a p-type substrate common to the two sections A and B, and
the separation region lies over the p-type substrate common to the two sections A and B.

4. The device of claim 3, wherein an upper n-type cladding is disposed over sections A and B.

5. The device of claim 1, wherein the material of the separation region is configured to have deep acceptor levels as an electron trap.

6. The device of claim 1, wherein the separation region comprises an iron-doped material.

7. The device of claim 1, wherein the separation region further comprises InGaAsP.

8. The device of claim 1, wherein the material of the separation region is configured to have deep level traps acting on both electrons and holes.

9. The device of claim 1, wherein the material of the separation region is deposited in a transition region etched between sections A and B.

10. The device of claim 1, wherein the semi-insulating separation region is butt-coupled to the two sections A and B.

11. The device of claim 1, wherein one of the two sections is a laser source.

12. The device of claim 11, wherein the laser source is a distributed feedback laser source.

13. The device of claim 12, further comprising a DFB grating disposed over one of the two sections.

14. The device of claim 1, wherein one of the two sections is a modulator.

15. The device of claim 14, wherein one of the two sections is an EAM modulator.

* * * * *